United States Patent
Canclini et al.

(10) Patent No.: US 9,250,298 B2
(45) Date of Patent: Feb. 2, 2016

(54) STACKED POWER SUPPLY MONITOR WITH SENSE-REPLICA LOOP

(75) Inventors: Athos Canclini, Como (IT); Willem Johannes Kindt, Berkel en Rodenrijs (NL)

(73) Assignee: NATIONAL SEMICONDUCTOR CORPORATION, Santa Clara, CA (US)

( * ) Notice: Subject to any disclaimer, the term of this patent is extended or adjusted under 35 U.S.C. 154(b) by 1010 days.

(21) Appl. No.: 13/086,156

(22) Filed: Apr. 13, 2011

(65) Prior Publication Data

US 2011/0291485 A1    Dec. 1, 2011

(30) Foreign Application Priority Data

May 31, 2010    (IT) .................................. BO10A0337

(51) Int. Cl.
| | | |
|---|---|---|
| *G01N 27/416* | (2006.01) | |
| *G01R 31/36* | (2006.01) | |
| *G01R 19/165* | (2006.01) | |
| *H01M 10/48* | (2006.01) | |
| *H02J 7/00* | (2006.01) | |
| *H03K 5/24* | (2006.01) | |
| *H01M 10/0525* | (2010.01) | |

(52) U.S. Cl.
CPC ...... *G01R 31/3658* (2013.01); *G01R 19/16542* (2013.01); *G01R 31/3624* (2013.01); *H01M 10/482* (2013.01); *H02J 7/0021* (2013.01); *H03K 5/2445* (2013.01); *H01M 10/0525* (2013.01); *Y02T 10/7011* (2013.01); *Y02T 10/7055* (2013.01)

(58) Field of Classification Search
USPC ........................................................ 324/433
See application file for complete search history.

(56) References Cited

U.S. PATENT DOCUMENTS

| 6,166,549 | A | 12/2000 | Ashtiani et al. | |
|---|---|---|---|---|
| 6,639,408 | B2 | 10/2003 | Yudahira et al. | |
| 7,741,811 | B2 * | 6/2010 | Daio ............................. | 320/122 |
| 7,999,554 | B2 * | 8/2011 | Bucur et al. .................. | 324/434 |

(Continued)

FOREIGN PATENT DOCUMENTS

| DE | 10 2006 036 834 A1 | 2/2007 |
|---|---|---|
| FR | 2899340 A1 | 10/2007 |
| GB | 2 322 488 A | 6/1998 |

OTHER PUBLICATIONS

Search Report dated Apr. 6, 2011 in connection with Italian Patent Application No. IT BO20100337.

*Primary Examiner* — Richard V Muralidar
*Assistant Examiner* — David Henze-Gongola
(74) *Attorney, Agent, or Firm* — Andrew Viger; Frank D. Cimino

(57) ABSTRACT

An apparatus includes a sense module configured to be coupled to at least one power supply, where the sense module has a first leg. The apparatus also includes a replica module having a second leg, where the first and second legs have a common structure. The apparatus further includes a feedback loop configured to cause an output voltage across terminals of the replica module to at least substantially equal an input voltage across terminals of the sense module based on sense currents in the first and second legs. At least one cascode stage coupled to the sense module can be configured to reduce a voltage at which one or more signals from the sense module are referenced. One or more trim units can be used to reduce a gain error and/or an offset error between the input voltage and the output voltage.

19 Claims, 6 Drawing Sheets

(56) References Cited

U.S. PATENT DOCUMENTS

| | | |
|---|---|---|
| 2002/0063573 A1 | 5/2002 | Genova et al. |
| 2005/0110464 A1* | 5/2005 | Baker .......................... 320/134 |
| 2006/0250166 A1 | 11/2006 | Sack et al. |
| 2007/0200632 A1* | 8/2007 | Jung et al. .................... 330/311 |
| 2008/0100266 A1 | 5/2008 | Sobue |
| 2008/0265947 A1 | 10/2008 | Sobue |
| 2009/0179650 A1 | 7/2009 | Omagari |
| 2010/0066378 A1* | 3/2010 | Ahmadi et al. ............... 324/429 |
| 2010/0173183 A1* | 7/2010 | Kadirvel et al. ............... 429/90 |
| 2010/0289497 A1* | 11/2010 | Lum-Shue-Chan et al. .. 324/426 |

* cited by examiner

STACKED POWER SUPPLY MONITOR WITH SENSE-REPLICA LOOP

CROSS-REFERENCE TO RELATED APPLICATION AND PRIORITY CLAIM

This application claims priority under 35 U.S.C. §119 to Italian Patent Application No. BO2010A000337 filed on May 31, 2010, which is hereby incorporated by reference.

TECHNICAL FIELD

This disclosure is generally directed to power supply monitors and more specifically to a stacked power supply monitor with a sense-replica loop.

BACKGROUND

Many types of devices and systems use power supplies that are stacked or coupled in series. For example, electric vehicles often include multiple lithium batteries or other batteries arranged in stacks. Each battery is typically designed to provide a specified voltage (such as approximately 5V) up to a maximum voltage (such as approximately 5.5V). In a twelve-battery stack, the stack could be designed to provide a voltage of approximately 60V. It may be necessary or desirable to measure the voltage across individual batteries in the stack. This could be useful, for example, to control the charging or discharging of individual batteries in the stack. However, batteries near the "top" of the stack may be at significantly higher voltages (such as approximately 45V-55V), which makes it difficult to measure the voltage across those batteries.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 7, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
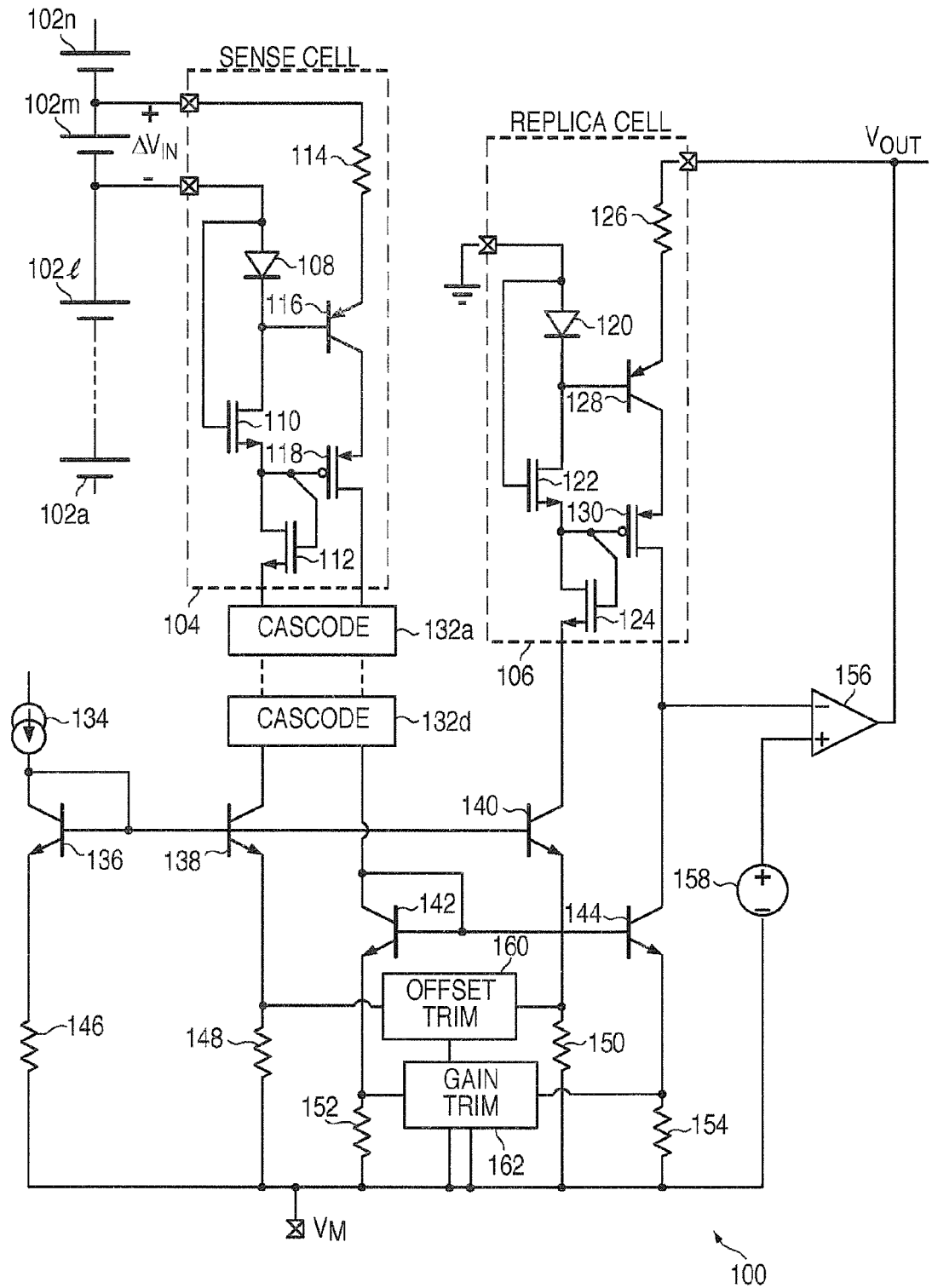
FIG. 1 illustrates an example stacked power supply monitor with a sense-replica loop according to this disclosure.

FIG. 1 illustrates an example stacked power supply monitor 100 with a sense-replica loop according to this disclosure. As shown in FIG. 1, the power supply monitor 100 includes or is used in conjunction with a stack of power supplies 102a-102n. The power supplies 102a-102n represent any suitable sources of power, such as batteries (like lithium or other types of batteries), super-capacitors, fuel cells, or other voltage sources. Any number of power supplies could be coupled in series to form the stack, such as twelve lithium batteries in an electric vehicle.

The power supply monitor 100 measures an input voltage $\Delta V_{IN}$ across at least one of the power supplies (in this case, power supply 102m) in the stack. For example, the continuous voltage across each power supply 102a-102n could reach a maximum of approximately 5.5V, while the maximum voltage at the top of the stack could be approximately 60V. In general, the power supply monitor 100 operates by generating a sense current through a voltage-to-current sense module 104 based on the voltage $\Delta V_{IN}$ across the power supply 102m and mirroring that sense current into a voltage-to-current replica module 106 using a precise current mirror tied to a negative supply voltage rail (such as about −5V). The replica module 106 is identical or substantially identical to the sense module 104 in structure.

As noted above, the voltage at the power supply being sensed could be high, such as up to approximately 60V or even more. In this example, the replica module 106 has one of its terminals coupled to ground and an output voltage $V_{OUT}$ on its other terminal. The replica module 106 generates a sense current based on the voltage $V_{OUT}$, and the circuitry in the power supply monitor 100 operates to force the sense currents to be equal, thereby forcing the output voltage $V_{OUT}$ to be at least substantially equal to the input voltage $\Delta V_{IN}$. As a result, the replica module 106 outputs a measure of the voltage $\Delta V_{IN}$ across the power supply being measured, where that output voltage $V_{OUT}$ is referenced to ground.

In this example, the sense module 104 includes a left leg containing a diode 108 and n-channel metal oxide semiconductor (NMOS) transistors 110-112. The sense module 104 also includes a right leg containing a resistor 114, a bipolar transistor 116, and a p-channel metal oxide semiconductor (PMOS) transistor 118. The left leg of the sense module 104 is coupled to a lower-voltage terminal of the power supply 102m being measured. The right leg of the sense module 104 is coupled to a higher-voltage terminal of the power supply 102m being measured. The replica module 106 has a similar structure with a left leg containing a diode 120 and NMOS transistors 122-124 and a right leg containing a resistor 126, a bipolar transistor 128, and a PMOS transistor 130. The left leg of the replica module 106 is coupled to ground, and the right leg of the replica module 106 is coupled to an output of the monitor 100. In particular embodiments, the components 108-118 and the corresponding components 120-130 of the modules 104-106 are matched, and the components are laid out using a common centroid approach.

Each of the diodes 108, 120 includes any suitable structure for substantially limiting current flow to one direction, such as a diode-connected transistor. Each NMOS transistor 110-112, 122-124 includes any suitable n-channel MOSFET transistor. Each resistor 114, 126 includes any suitable resistive structure having any suitable resistance, such as a 1 MΩ resistor. Each bipolar transistor 116, 128 includes any suitable bipolar transistor structure, such as a PNP transistor. Each PMOS transistor 118, 130 includes any suitable p-channel MOSFET transistor.

The power supply monitor 100 can also include one or more cascode stages 132a-132d. The cascode stages 132a-

132d generally operate to lower the voltage at which signals output by the sense module 104 are referenced. Each cascode stage 132a-132d essentially absorbs the voltage of one or more of the power supplies 102a-102n. In this manner, low-voltage transistors can be used in the cascode stages 132a-132d, and the large common mode voltage (with respect to ground) that exists higher in the stack can be handled. Any suitable number of cascode stages 132a-132d could be used, including a single cascode stage, multiple cascode stages, or zero cascode stages. As a particular example, each power supply 102a-102n could be coupled to an associated cascode stage.

Each cascode stage 132a-132d includes any suitable cascode structure. As noted above, in some embodiments, the cascode stages 132a-132d can include low-voltage transistors. In particular embodiments, the cascode stages 132a-132d are formed using a silicon-on-insulator (SOI) structure in which all cascode transistors are isolated from a silicon substrate with silicon dioxide or other dielectric material(s). This allows a low-voltage SOI process to be used with stacks where the common mode voltage at the top of the stack is around 60V or even more. In other embodiments, a high-voltage fabrication process could be used to implement the stacked power supply monitor 100.

The power supply monitor 100 further includes a current source 134, which generates a current that flows through a transistor 136. For example, the current source 134 could generate a small current, such as a current less than 1 μA. The current through the transistor 136 is mirrored through transistors 138-140, which are coupled to the left legs of the sense module 104 and replica module 106, respectively. The currents in the left legs of the sense module 104 and replica module 106 may represent reference currents used to measure the voltage $\Delta V_{IN}$ and generate the voltage $V_{OUT}$. The right legs of the sense module 104 and replica module 106 are respectively coupled to transistors 142-144. The current through the right leg of the sense module 104 and the transistor 142 represents the sense current, and this sense current is mirrored through the transistor 144 and the right leg of the replica module 106. The mirrored sense current creates the output voltage $V_{OUT}$ in the right leg of the replica module 106. The current source 134 includes any suitable structure for generating a current. Each transistor 136-144 includes any suitable transistor structure, such as an NPN bipolar transistor.

Resistors 146-154 are coupled in series with the transistors 136-144, respectively. The resistors 146-154 are also coupled to a lower voltage rail $V_M$, which could represent a negative voltage. The resistors 146-150 are degeneration resistors for the current mirror formed by the transistors 136-140, and the resistors 152-154 are degeneration resistors for the current mirror formed by the transistors 142-144. Each resistor 146-154 includes any suitable resistive structure having any suitable resistance. For instance, each of the resistors 146-150 could represent a 420 kΩ resistor, and each of the resistors 152-154 could represent a 260 kΩ resistor. Note, however, that the resistors 146-154 could be omitted (replaced with straight wires).

The right leg of the replica module 106 is coupled to the inverting input of an operational amplifier 156. The non-inverting input of the operational amplifier 156 is coupled to a voltage source 158, which provides a substantially constant voltage to the operational amplifier 156. In this example, the substantially constant voltage is generally equal to the voltage on the lower voltage rail $V_M$ plus the voltage provided by the voltage source 158. The output of the operational amplifier 156 is coupled to the output $V_{OUT}$ of the power supply monitor 100, forming a negative feedback loop. The operational amplifier 156 includes any suitable amplifier structure. The voltage source 158 includes any suitable structure for providing a voltage.

In one aspect of operation, the sense module 104 converts the input voltage $\Delta V_{IN}$ (the voltage of the power supply being measured) into a current. The replica module 106 converts the output voltage $V_{OUT}$ into a current in the same manner as the sense module 104. The two currents are compared using the amplifier 156, and the difference is amplified. Because of the negative feedback loop, the circuit settles in a condition where the two currents are substantially equal, which forces the input voltage $\Delta V_{IN}$ to substantially equal the output voltage $V_{OUT}$. Converting the input voltage $V_{IN}$ into a current allows the current to be routed through one or more cascode stages 132a-132d to gradually shift the signal from a high common mode voltage (such as about 60V) to a potential near ground.

Figure 2:
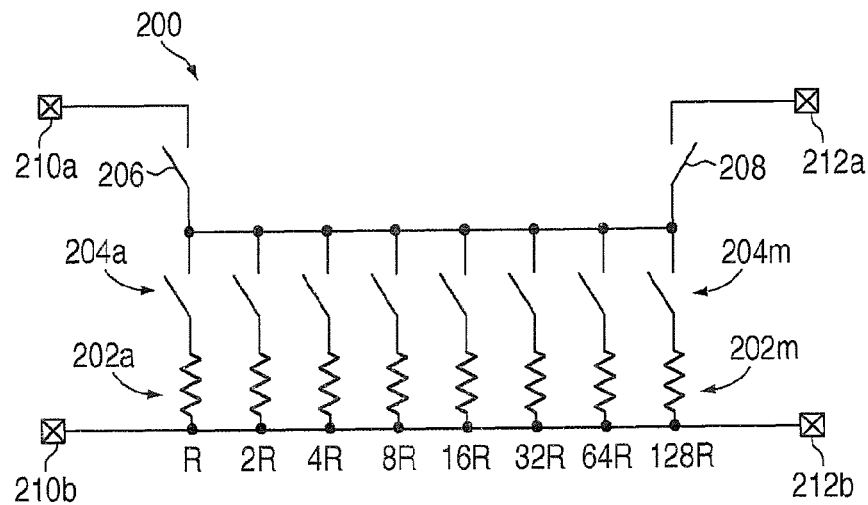
FIG. 2 illustrates an example trim unit in a stacked power supply monitor with a sense-replica loop according to this disclosure.

In this example, the current source 134 provides a current that flows through the transistor 136, and that current is mirrored through the transistors 138-140. The mirrored currents flow through the left branches of the sense module 104 and the replica module 106 to provide references for the modules 104-106. However, the resistances of the resistors 148-150 may be slightly different, such as due to variations in the manufacturing process. Even if the difference is small, it can create a difference between the reference currents flowing through the resistors 148-150. An offset trim unit 160 is used to trim at least one of the resistors 148-150, such as by placing a resistance in parallel with one of the resistors 148-150 to adjust the resistance of that resistor 148-150. This can help to reduce or eliminate an offset between the input voltage $\Delta V_{IN}$ compared to the output voltage $V_{OUT}$. The offset trim unit 160 includes any suitable structure for trimming or adjusting a resistance of at least one resistor. An example embodiment of the offset trim unit 160 is shown in FIG. 2, which is described below.

The sense current that flows through the right branch of the sense module 104 is proportional to the input voltage $\Delta V_{IN}$. That sense current flows through the transistor 142 and is mirrored through the transistor 144. The sense current through the transistor 144 generates the output voltage $V_{OUT}$, which is referenced to ground. However, gain error can exist due to any mismatch between the resistances of the resistors 152-154. Ideally, the resistors 152-154 are perfectly matched, and the output voltage $V_{OUT}$ equals the input voltage $\Delta V_{IN}$. If there is any resistor mismatch, $V_{OUT}=a \times \Delta V_{IN}$, where the value of a is close to but not equal to one. The magnitude of the difference between a and one depends on the amount of resistor mismatch. To help compensate for this, a gain trim unit 162 is used to trim at least one of the resistors 152-154, such as by placing a resistance in parallel with one of the resistors 152-154 to adjust the resistance of that resistor 152-154. This can help to reduce or eliminate the gain error caused by resistor mismatch between the resistors 152-154. The gain trim unit 162 includes any suitable structure for trimming or adjusting a resistance of at least one resistor. An example embodiment of the gain trim unit 162 is shown in FIG. 2 (since both the offset and gain trim units 160-162 could have similar or identical structures).

The lower voltage rail $V_M$ can provide a negative voltage to various components of the power supply monitor 100. For example, the resistors 146-154 and the gain trim units 160-162 could be coupled to the lower voltage rail $V_M$. The lower voltage rail $V_M$ could provide any suitable negative voltage, such as approximately −5V. This voltage could be generated or otherwise provided by any suitable source, such as a charge pump.

An additional feature of the power supply monitor 100 is that it supports a shut down mode of operation in which the current through the right leg of the sense module 104 drops to leakage current levels (such as much less than 1 μA). The shut down mode can be entered by switching off a current that biases the diodes 108, 120 (such as when the diodes are implemented using bipolar transistors). This can help to significantly reduce energy losses caused by the power supply monitor 100.

Although FIG. 1 illustrates one example of a stacked power supply monitor 100 with a sense-replica loop, various changes may be made to FIG. 1. For instance, in the example shown in FIG. 1, the power supply monitor 100 is configured to measure the voltage across a single one of the power supplies 102a-102n. However, various components in FIG. 1 can be replicated and used to measure the voltages across multiple power supplies 102a-102n. As a particular example, the entire circuit shown in FIG. 1 could be replicated for each power supply in a stack. As described in more detail below, though, other techniques can be used to reduce the number of replicated components. Moreover, a single sense module and a single replica module could be used to measure the voltage across multiple power supplies, such as two or more batteries. Also, while certain circuit elements are shown in FIG. 1, any suitable circuitry could be used to perform the same or similar functions described above. For example, FIG. 1 mirrors the current from the right leg of the sense module 104 into the right leg of the replica module 106, and the feedback loop operates to equalize these currents. However, other control approaches could be used, such as when the current from the right leg of the replica module 106 is mirrored into the right leg of the sense module 104. These currents could also be passed through matched resistances to generate voltages, and the feedback loop could compare those voltages. In addition, the left legs of the modules 104-106 could be omitted, and each module 104-106 could include a single PMOS transistor and a single resistor. The gate of the PMOS transistor could be tied to the negative terminal of the power supply being measured. The source of the PMOS transistor can be tied to one terminal of the resistor, and the second terminal of the resistor can be tied to the positive terminal of the power supply. The drain of the PMOS transistor can provide an output current.

FIG. 2 illustrates an example trim unit 200 in a stacked power supply monitor with a sense-replica loop according to this disclosure. The trim unit 200 could be used, for example, as the offset trim unit 160 or the gain trim unit 162 of the power supply monitor 100 of FIG. 1.

As shown in FIG. 2, the trim unit 200 includes multiple resistors 202a-202m coupled in parallel. Each resistor 202a-202m includes any suitable resistive structure having any suitable resistance. In this example, the resistors 202a-202m increase in a binary fashion from left to right, where each subsequent resistor has a resistance that is double the prior resistor's resistance.

The trim unit 200 also includes multiple switches 204a-204m, where each switch 204a-204m is coupled in series with one of the resistors 202a-202m. The switches 204a-204m operate to control which resistors 202a-202m are used to trim an external resistor. For example, when eight switches 204a-204m are coupled to eight binary resistors 202a-202m as shown in FIG. 2, the trim unit 200 can generate 255 unique resistances by opening and/or closing the various switches 204a-204m to generate different combinations of resistors 202a-202m. Each switch 204a-204m includes any suitable switching device, such as a transistor.

Two additional switches 206-208 control which external resistor is trimmed by the trim unit 200. A first pair of terminals 210a-210b is coupled to the first external resistor that could be trimmed by the trim unit 200. A second pair of terminals 212a-212b is coupled to the second external resistor that could be trimmed by the trim unit 200. For example, as shown in FIG. 1, the offset trim unit 160 is coupled to the resistor 148 on the left and the resistor 150 on the right. One of the switches 206-208 can be opened and the other closed to control which of the resistors 148-150 is trimmed by the resistors 202a-202m. Similarly, the gain trim unit 162 in FIG. 1 is coupled to the resistor 152 on the left and the resistor 154 on the right. One of the switches 206-208 can be opened and the other closed to control which of the resistors 152-154 is trimmed by the resistors 202a-202m. Each switch 206-208 includes any suitable switching device, such as a transistor. Each terminal 210a-210b, 212a-212b includes any suitable structure for coupling to an external circuit or device.

In this trim unit 200, one or more of the resistors 202a-202m can be coupled in parallel to one of multiple external resistors. The specific resistors 202a-202m used to trim the external resistor are controlled by the switches 204a-204m. By coupling these resistor(s) 202a-202m in parallel with the external resistor, this drops the overall resistance (due to the standard parallel resistance formula $1/R_1 + \ldots + 1/R_N = 1/R_{TOTAL}$). The specific external resistor that is trimmed is controlled by the switches 206-208. For instance, the external resistor with the higher resistance could be identified, and the switch 206-208 associated with that resistor could be closed. This allows trimming in order to reduce the higher resistance to be at or substantially near the lower resistance of the other external resistor. In other embodiments, one or more resistor(s) 202a-202m could be coupled in series with the lower external resistor to increase that external resistor's resistance.

In some embodiments, the trim unit 200 forms a resistive digital-to-analog converter (DAC). The DAC can convert a digital input value into a corresponding analog resistance. In particular embodiments, the trim unit 200 receives a nine-bit digital input value, such as an eight-bit value and a one-bit sign value. The one-bit sign value can be used to control the switches 206-208, such as by using the sign value to control the switch 206 and an inverted sign value to control the switch 208. The eight-bit value can be used to control the eight switches 202a-202m in FIG. 2.

Although FIG. 2 illustrates one example of a trim unit 200 in a stacked power supply monitor with a sense-replica loop, various changes may be made to FIG. 2. For example, the trim unit 200 could include any number of resistors 202a-202m and switches 204a-204m. Also, while each resistor 202a-202m is shown as a single resistor, a resistor 202a-202m could represent multiple resistors coupled in series and/or in parallel. In addition, separate trim units could be coupled to separate external resistors (eliminating the use of the switches 206-208), and one or multiple trim units can operate to substantially equalize the resistances of those external resistors.

Figure 3:
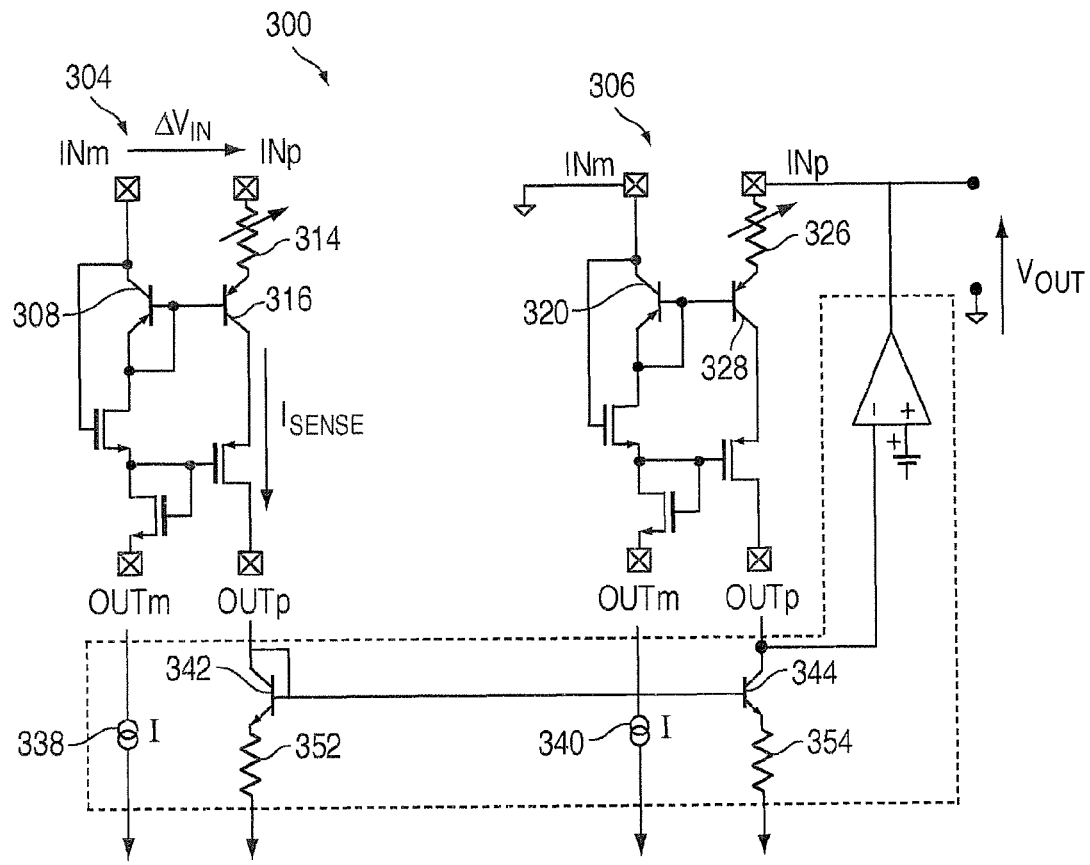
FIG. 3 illustrates details of an example sense-replica loop in a stacked power supply monitor according to this disclosure.

FIG. 3 illustrates details of an example sense-replica loop 300 in a stacked power supply monitor according to this disclosure. In this example, the sense-replica loop 300 includes a sense module 304 and a replica module 306. The sense module 304 includes a diode-connected transistor 308, and the replica module 306 includes a diode-connected transistor 320. Each transistor 308, 320 represents a bipolar PNP transistor having its emitter coupled to its base. Also, resistors 314 and 326 in the sense and replica modules 304-306 are shown here as being adjustable or variable. The resistors 314 and 326 could be adjusted to perform coarse gain trimming, while fine gain trimming could occur using the gain trim unit 162. Transistors 316 and 328 are also included in the sense and replica modules 304-306.

The left legs of the sense and replica modules 304-306 are coupled to current sources 338-340, respectively. The current sources 338-340 could represent current mirror transistors, such as transistors 138-140 shown in FIG. 1. Ideally, reference currents I that flow through the left legs of the modules 304-306 and through the current sources 338-340 are equal. However, the offset trim unit 160 can be used to help make the reference currents I identical or substantially equal.

The right legs of the sense and replica modules 304-306 are coupled to transistors 342-344, respectively. Those transistors 342-344 are coupled to resistors 352-354, respectively. The voltage $\Delta V_{IN}$ across the input terminals $IN_m$ and $IN_p$ of the sense module 304 generates a sense current $I_{SENSE}$ through the right leg of the sense module 304. The sense current $I_{SENSE}$ is mirrored through the right leg of the replica module 306 by the transistors 352-354, which generates the output voltage $V_{OUT}$. Ideally, the sense currents $I_{SENSE}$ that flow through the right legs of the modules 304-306 are equal. However, the gain trim unit 162 (possibly along with the adjustable resistances 314 and 326) can be used to help make the sense currents $I_{SENSE}$ identical or substantially equal.

In particular embodiments, the sense current $I_{SENSE}$ in the sense module 304 could be expressed as:

$$I_{SENSE} = \frac{IN_p - (IN_m - V_{CB} + V_{BE})}{R}$$

where $IN_p$ and $IN_m$ denote the voltages on the input terminals of the sense module 304 (where $IN_p > IN_m$). Also, $V_{CB}$ and $V_{BE}$ denote the collector-to-base voltage and the base-to-emitter voltage of the transistor 316, and R denotes the resistance of the resistor 314. The collector-to-base voltage of the transistor 316 could be expressed as:

$$V_{CB} \cong V_T \ln \frac{I}{I_{SENSE}}$$

where $V_T$ denotes the threshold voltage of the transistor 316, and I denotes the reference current through the left leg of the sense module 304. The resistance R and the ratio $I/I_{SENSE}$ can both be adjusted using the gain trim unit 162 (and optionally the adjustable resistors 314 and 326).

As noted above, the power supply monitor 100 can operate in a shut down mode of operation to conserve power. The shut down mode can be entered by switching off a current that biases the diode-connected transistors 308 and 320. When the biasing current is removed, the base current of each transistor 308 or 320 lifts its base voltage until the base-to-emitter voltage of the diode drops to zero, the diode is off, and no current is sent to a current mirror lower in the circuit. In this example embodiment, each transistor 308, 320 is a PNP bipolar transistor forming a diode, where the junction forming the diode is the base-collector junction of the PNP transistor. The base-collector junction of a PNP transistor can tolerate high reverse bias voltages (such as 5.5V reverse bias voltages).

Although FIG. 3 illustrates details of one example sense-replica loop 300 in a stacked power supply monitor, various changes may be made to FIG. 3. For example, the sense and replica modules could be implemented in any other suitable manner.

Figure 4:
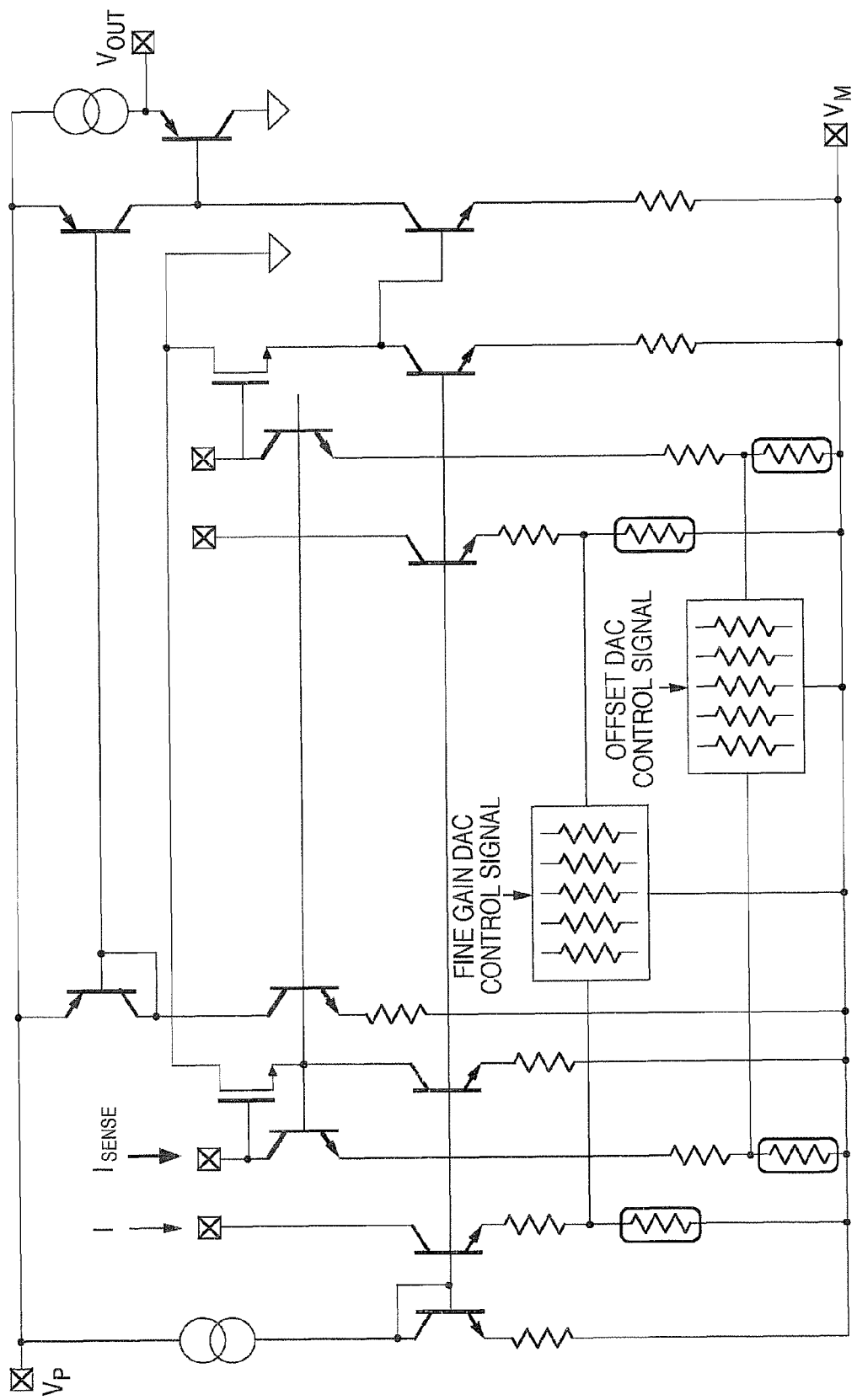
FIG. 4 illustrates additional details of an example stacked power supply monitor with a sense-replica loop according to this disclosure.

FIG. 4 illustrates additional details of an example stacked power supply monitor with a sense-replica loop according to this disclosure. In particular, FIG. 4 illustrates an example implementation of the components shown in the dashed lines of FIG. 3. These components include current sources and mirrors, an operational amplifier, and trim units.

The circled resistors represent the resistors being trimmed using fine gain and offset trim units (coarse gain can occur using the variable resistors in FIG. 3). The left pair of terminals can be coupled to the sense module 304, and the right pair of terminals can be coupled to the replica module 306. The voltage rail $V_M$ denotes the lower supply rail (such as approximately −5V). A voltage rail $V_p$ denotes a higher supply rail, which could represent any suitable voltage depending on the application (such as approximately +5V). In addition, the output voltage $V_{OUT}$ in FIG. 4 can be coupled to one of the terminals $IN_p$ of the replica module 304 as shown in FIG. 3.

Although FIG. 4 illustrates additional details of one example stacked power supply monitor with a sense-replica loop, various changes may be made to FIG. 4. For example, an operational amplifier could be implemented in any other suitable manner. Also, the control signals for the fine gain trim and offset trim units could be generated by or received from any suitable source, such as an external controller.

Figure 5:
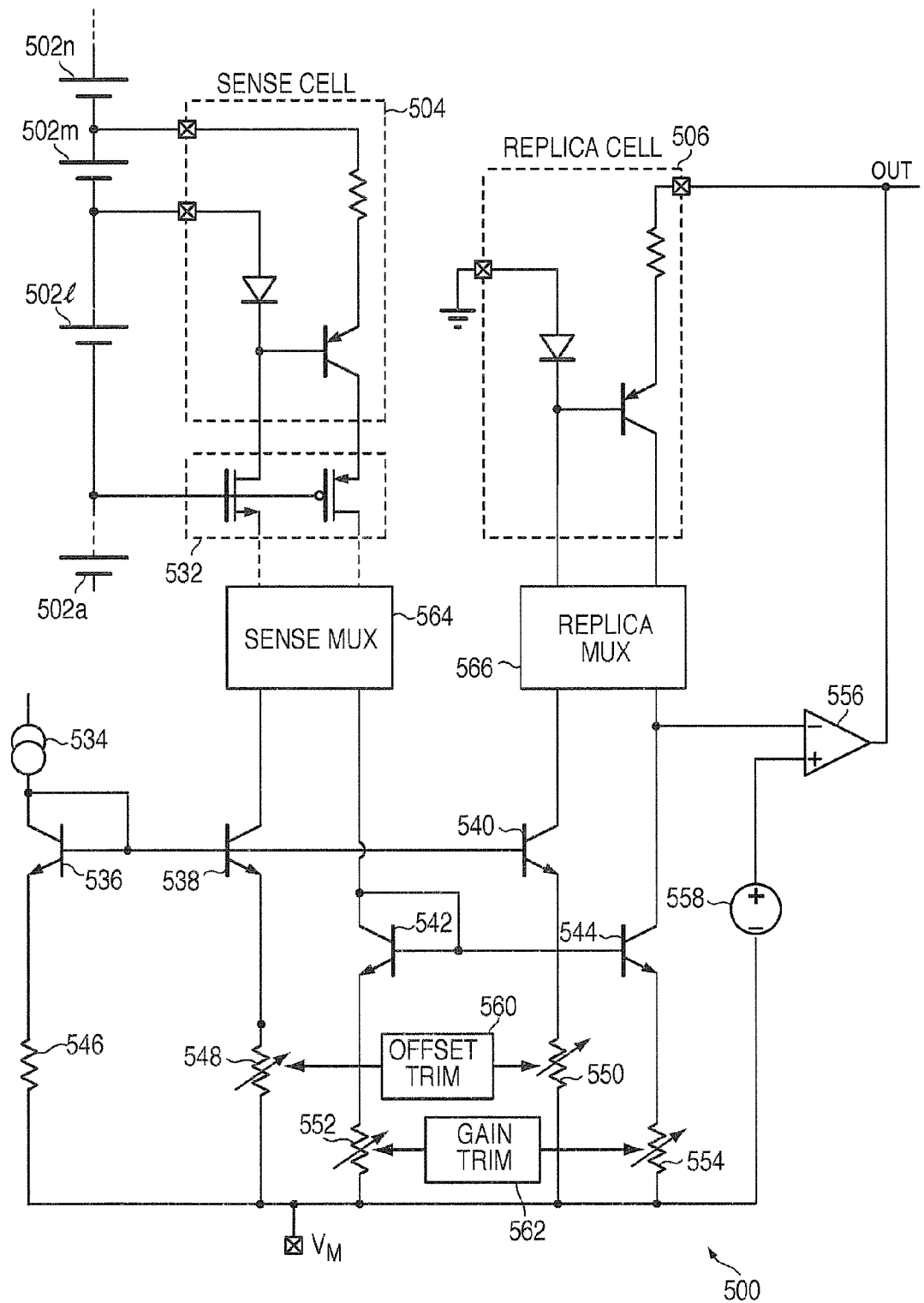
FIGS. 5 and 6 illustrate other example stacked power supply monitors with sense-replica loops according to this disclosure.
Figure 6:
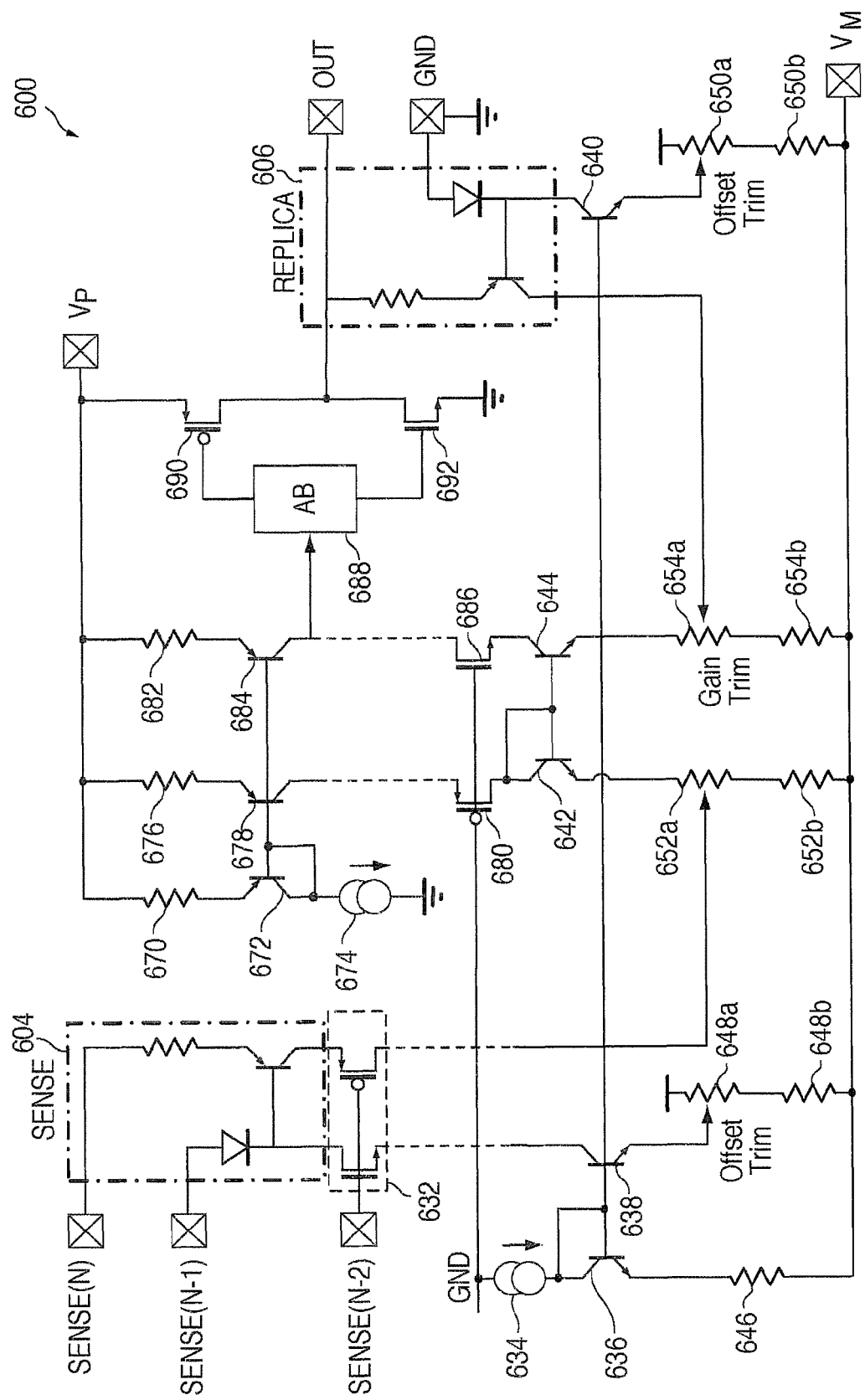

FIGS. 5 and 6 illustrate other example stacked power supply monitors with sense-replica loops according to this disclosure. In FIG. 5, a stacked power supply monitor 500 includes or is used in conjunction with a stack of power supplies 502a-502n. The power supply monitor 500 includes sense and replica modules 504-506 for measuring a voltage across at least one of the power supplies (in this case, power supply 502m). Each of the modules 504-506 is shown as including a diode in its left leg and a resistor and a PNP bipolar transistor in its right leg. The modules 504-506 could, however, have any of the structures described above.

The sense module 504 is coupled to zero or more cascode stages 532. Each cascode stage 532 includes an NMOS transistor on the left and a PMOS transistor on the right. In this example, each cascode stage 532 could be biased by one of the power supplies being measured using the power supply monitor 500. In other words, the transistors in each cascode stage 532 could be coupled to one of the power supplies being measured. In this example, bias current in the left branch of the cascode stage 532 is drawn from below (such as from a lower cascode stage), so the left branch uses an NMOS transistor. Also, the sense module 504 is actively pushing a sense current in the right branch of the cascode stage 532, so the right branch uses a PMOS transistor. The remaining structures 534-562 may be the same as or similar to corresponding components in FIG. 1 described above.

In this example, the sense and replica modules 504-506 measure the voltage across a single power supply 502m. However, the sense and replica modules 504-506 can be duplicated for other power supplies to be monitored (possibly for each individual power supply). In other words, the sense and replica modules 504-506 shown in FIG. 5 are used to monitor the power supply 502m. Similar sense and replica modules 504-506 could be used to monitor each of the other power supplies in the stack.

In FIG. 5, the components 534-562 need not be replicated for each power supply to be monitored (although they obviously could be). Instead, a sense multiplexer 564 is coupled to multiple sense modules 504. The sense multiplexer 564 is used to control which sense module 504 is coupled to the other components 534-562 in the power supply monitor 500. Similarly, a replica multiplexer 566 is coupled to multiple replica modules 506. The replica multiplexer 566 is used to control which replica module 506 is coupled to the other components 534-562 in the power supply monitor 500.

By controlling the multiplexers 564-566, it is possible to measure the voltage across an individual power supply (or a group of power supplies) using one of multiple sense modules and one of multiple replica modules. This could allow, for example, an external controller to control the multiplexers 564-566 such that the power supplies in the stack are monitored sequentially or in any other suitable order. The use of the multiplexers 564-566 can help to reduce the circuitry needed to monitor the multiple power supplies, which can reduce the size and cost of the power supply monitor 500. Each multiplexer 564-566 includes any suitable structure for receiving multiple input signals and selectively outputting a subset of those input signals.

Note that FIG. 5 illustrates one example technique for sharing circuitry to monitor the voltage across different power supplies. Other techniques could also be used. For example, a multiplexer could be inserted between the sense module 504 and the power supplies 502a-502n, where the multiplexer controls which power supply is coupled to the sense module 504. In these embodiments, one sense module 504 and one replica module 506 may be used, although the multiplexer may require the use of high-voltage MOSFET transistors or other structures.

In FIG. 6, a stacked power supply monitor 600 includes a sense module 604 and a replica module 606. These modules 604-606 could be the same as or similar to any of the sense/replica modules described above. The power supply monitor 600 also includes zero or more cascode stages 632. A current source 634 and transistors 636-640 generate a reference current through the left leg of the sense module 604 and the right leg of the replica module 606.

In this particular example, transistors 642-644 are not coupled to the other legs of the sense and replica modules 604-606. Instead, the power supply monitor 600 here employs a folded cascode design. A resistor 670, a PNP bipolar transistor 672, and a current source 674 are coupled in series between the voltage rail $V_p$ and ground. Also, a resistor 676, a PNP bipolar transistor 678, and a PMOS transistor 680 are coupled in series between the voltage rail V, and the transistor 642. Further, a resistor 682, a PNP bipolar transistor 684, and an NMOS transistor 686 are coupled in series between the voltage rail $V_p$ and the transistor 644. In addition, the transistor 684 is coupled to an amplifier 688 (such as a Class AB amplifier), which drives a PMOS transistor 690 and an NMOS transistor 692. The transistors 680 and 686 could be replicated one or more times to form additional cascode stages in the folded cascode design. The output of the folded cascode design is generated between the transistors 690-692, which is also coupled to the replica module 606. This output represents the output voltage $V_{OUT}$.

The transistors 636, 638, 640, 642, and 644 are coupled in series with resistors 646, 648a-648b, 650a-650b, 652a-652b, and 654a-654b, respectively. The resistance of at least one of the resistors 648a-648b, 650a-650b can be adjusted using an offset trim unit. Similarly, the resistance of at least one of the resistors 652a-652b, 654a-654b can be adjusted using a gain trim unit. The trim units are not shown in FIG. 6 but could have any suitable structure(s), such as that shown in FIG. 2 and described above.

Although FIGS. 5 and 6 illustrate other examples of stacked power supply monitors with sense-replica loops, various changes may be made to FIGS. 5 and 6. For example, various components in FIG. 6 can be replicated and used to measure the voltages across other power supplies. Also, while certain circuit elements are shown in FIGS. 5 and 6, any suitable circuitry could be used to perform the same or similar functions described above. In addition, features shown as forming one or more of the power supply monitors in FIGS. 1-6 could be used in others of the power supply monitors in FIGS. 1-6.

Figure 7:
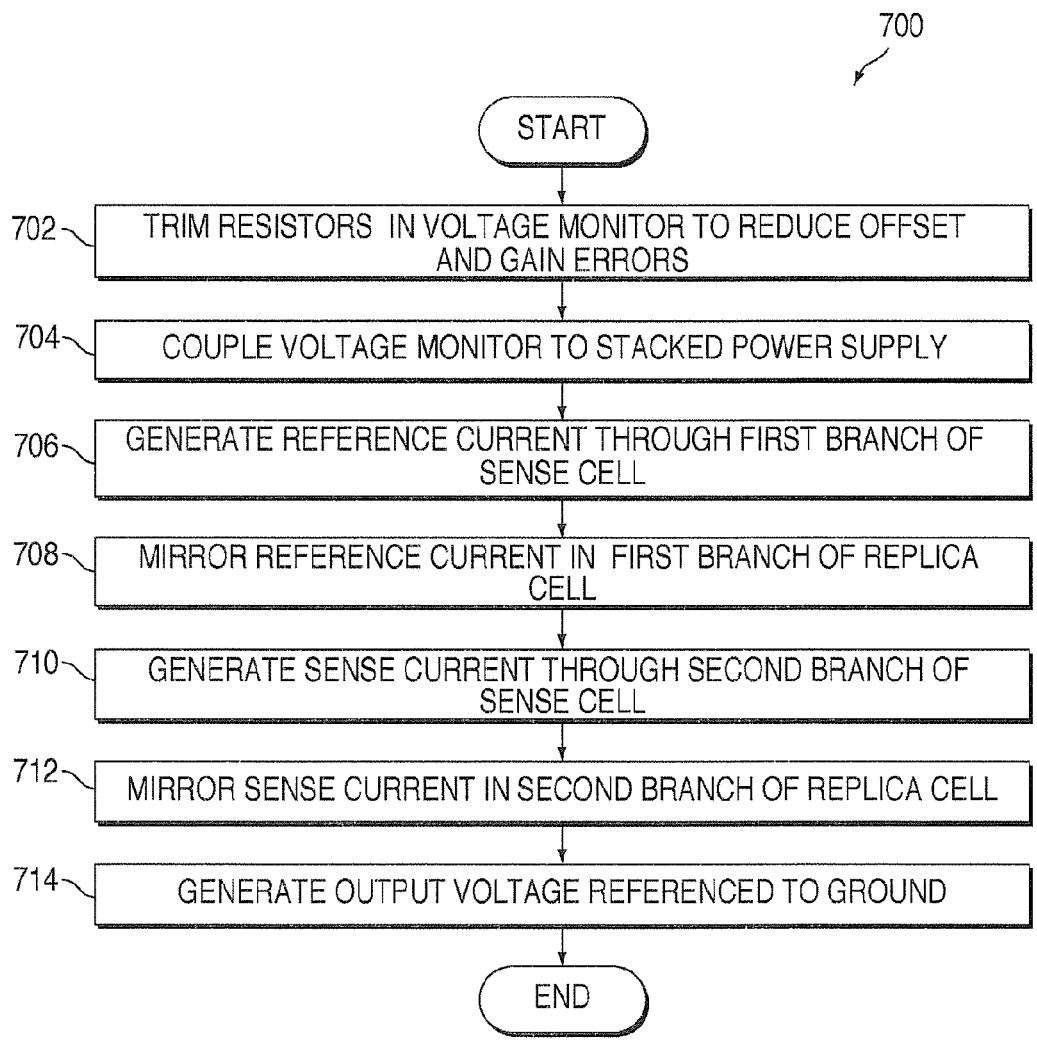
FIG. 7 illustrates an example method for monitoring a power supply in a stacked power supply system using a sense-replica loop according to this disclosure.

FIG. 7 illustrates an example method 700 for monitoring a power supply in a stacked power supply system using a sense-replica loop according to this disclosure. For ease of explanation, the method 700 is described with respect to the power supply monitor 100 shown in FIG. 1. However, the same or similar method 700 could be used with any other suitable power supply monitor.

Resistors in a voltage monitor are trimmed to reduce (and ideally eliminate) offset and gain errors at step 702. This could include, for example, coupling a known input voltage across the input terminals of the sense module 104 in the power supply monitor 100. This could also include the offset trim unit 160 trimming at least one of the resistors 148-150 to reduce or eliminate an offset between the input voltage $\Delta V_{IN}$ compared to the output voltage $V_{OUT}$. This could further include the gain trim unit 162 trimming at least one of the resistors 152-154 to reduce or eliminate the gain between the input voltage $\Delta V_{IN}$ compared to the output voltage $V_{OUT}$. In addition, this could include using an adjustable resistance in the sense and replica modules 104-106 to perform coarse gain trimming, while the gain trim unit 162 is used for more fine gain trimming.

The voltage monitor is coupled to a stacked power supply at step 704. This could include, for example, coupling the terminals of the sense module 104 in the power supply monitor 100 to at least one of the power supplies 102a-102n. This coupling could be permanent or temporary. For example, if a multiplexer is used, this coupling could involve setting the multiplexer to couple the power supply monitor 100 to a specific one of the power supplies 102a-102n.

A reference current is generated through a first branch of a sense cell at step 706. This could include, for example, the current source 134 generating a small current I, which is mirrored by the transistor 136 into the transistor 138 coupled to the left branch of the sense module 104. The reference current is mirrored in a first branch of a replica cell at step 708. This could include, for example, mirroring the current I using the transistor 140 coupled to the left branch of the replica module 106.

A sense current is generated through a second branch of the sense cell at step 710. This could include, for example, generating a sense current $I_{SENSE}$ that is proportional to the input voltage $\Delta V_{IN}$ across the input terminals of the sense module 104. The sense current $I_{SENSE}$ flows through the transistor 142. The sense current is mirrored through a second branch of the replica cell at step 712. This could include, for example, mirroring the sense current $I_{SENSE}$ through the transistor 144 and the second branch of the replica module 106.

This leads to the generation of an output voltage referenced to ground at step 714. This could include, for example, the current through the second branch of the replica module 106 creating a voltage that is supplied to the amplifier 156. This could also include the amplifier 156 generating the output voltage $V_{OUT}$, which equals or substantially equals the voltage $V_{IN}$ across the power supply (or supplies) being monitored.

Although FIG. 7 illustrates one example of a method 700 for monitoring a power supply in a stacked power supply system using a sense-replica loop, various changes may be made to FIG. 7. For example, while shown as a series of steps, various steps in FIG. 7 could overlap, occur in parallel, occur multiple times, or occur in a different order. Also, steps could be omitted, such as when the resistors are precisely matched or omitted, so no trimming is needed or required.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. An apparatus operable to monitor a voltage of a selected power source in a stacked power supply with multiple stacked power sources, comprising:
   a sense module coupled to at least one power source, the sense module configured to convert an input sense voltage $V_{IN}$ across the power source into a corresponding sense current;
   a replica module configured as a replica of the sense module, and referenced to ground, and configured to generate at a replica module output an output sense voltage $V_{OUT}$ based on a mirrored sense current;
   a current mirror configured to mirror the sense current from the sense module into the replica module as the mirrored sense current that generates the output sense voltage $V_{OUT}$; and
   an amplifier with an inverting input coupled to receive a voltage corresponding to the replica sense current, and a noninverting input coupled to a reference voltage referenced to ground, and an output coupled to the replica module output;
   the amplifier establishing a feedback loop configured to cause the output sense voltage $V_{OUT}$ to at least substantially equal the input sense voltage $V_{IN}$.

2. The apparatus of claim 1, further comprising:
   at least one cascode stage coupled to the sense module and configured to reduce a voltage at which one or more signals from the sense module are referenced.

3. The apparatus of claim 1, wherein:
   the sense module includes a reference current leg, and a parallel sense current leg that generates the sense current; and
   the replica module includes a replica reference current leg and a replica sense current leg that receives the mirrored sense current.

4. The apparatus of claim 3, further comprising:
   a plurality of resistances, each resistance coupled to one of the legs; and
   at least one trim unit configured to adjust at least one of the resistances.

5. The apparatus of claim 4, wherein:
   the plurality of resistances comprises a first resistance coupled to the reference leg, a second resistance coupled to the sense leg, a third resistance coupled to the replica reference leg, and a fourth resistance coupled to the replica sense leg; and
   the at least one trim unit comprises a first trim unit configured to adjust at least one of the first and second resistances and a second trim unit configured to adjust at least one of the third and fourth resistances.

6. The apparatus of claim 5, wherein:
   the first trim unit is configured to reduce a gain error between the input sense voltage $V_{IN}$ and the output sense voltage $V_{OUT}$; and
   the second trim unit is configured to reduce an offset error between the input sense voltage $V_{IN}$ and the output sense voltage $V_{OUT}$.

7. The apparatus of claim 6, wherein:
   the reference leg comprises a first variable resistance;
   the sense leg comprises a second variable resistance;
   the first and second variable resistances are adjustable to coarsely adjust the gain error; and
   the first trim unit is configured to more finely adjust the gain error.

8. The apparatus of claim 1, wherein:
   the sense module comprises one of multiple sense modules;
   the replica module comprises one of multiple replica modules; and
   the apparatus further comprises first and second multiplexers, the first multiplexer configured to output signals from one of the sense modules, the second multiplexer configured to output signals from one of the replica modules.

9. The apparatus of claim 1, further comprising:
   A folded cascode stage coupled to the replica module and configured to generate the output sense voltage $V_{OUT}$.

10. A system operable to monitor a voltage of power sources in a stacked power supply, comprising:
    a plurality of power sources coupled in series in a stacked arrangement; and
    a power monitor configured to measure a voltage across at least one of the power sources, the power monitor comprising:
      a sense module coupled to at least one power source, the sense module configured to convert an input sense voltage $V_{IN}$ across the power source into a corresponding sense current;
      a replica module configured as a replica of the sense module, and referenced to ground, and configured to generate at a replica module output an output sense voltage $V_{OUT}$ based on a mirrored sense current;
      a current mirror configured to mirror the sense current from the sense module into the replica module as the mirrored sense current that generates the output sense voltage $V_{OUT}$; and
      an amplifier with an inverting input coupled to receive a voltage corresponding to the replica sense current, and a noninverting input coupled to a reference voltage referenced to ground, and an output coupled to the replica module output;

the amplifier establishing a feedback loop configured to cause the output sense voltage $V_{OUT}$ to at least substantially equal the input sense voltage $V_{IN}$.

11. The system of claim 10, wherein the power monitor further comprises:

at least one cascode stage coupled to the sense module and configured to reduce a voltage at which one or more signals from the sense module are referenced.

12. The system of claim 10, wherein:

the sense module includes a reference current leg, and a parallel sense current leg that generates the sense current; and the replica module includes a replica reference current leg and a replica sense current leg that receives the mirrored sense current.

13. The system of claim 12, wherein the power monitor further comprises:

a plurality of resistances, each resistance coupled to one of the legs; and at least one trim unit configured to adjust at least one of the resistances.

14. The system of claim 13, wherein:

the plurality of resistances comprises a first resistance coupled to the reference leg, a second resistance coupled to the sense leg, a third resistance coupled to the replica reference leg, and a fourth resistance coupled to the replica sense leg; and the at least one trim unit comprises a first trim unit configured to adjust at least one of the first and second resistances and a second trim unit configured to adjust at least one of the third and fourth resistances.

15. The system of claim 14, wherein:

the first trim unit is configured to reduce a gain error between the input sense voltage $V_{IN}$ and the output sense voltage $V_{OUT}$; and the second trim unit is configured to reduce an offset error between the input sense voltage $V_{IN}$ and the output sense voltage $V_{OUT}$.

16. The system of claim 10, wherein:

the sense module comprises one of multiple sense modules;

the replica module comprises one of multiple replica modules and;

the power monitor further comprises first and second multiplexers, the first multiplexer configured to output signals from one of the sense modules, the second multiplexer configured to output signals from one of the replica modules.

17. The system of claim 10, wherein the power monitor further comprises:

a folded cascode stage coupled to the replica module and configured to generate the output sense voltage $V_{OUT}$.

18. A method useable in a stacked power supply to monitor respective voltages of multiple stacked power sources, comprising:

generating a sense current in a sense cell based on an input sense voltage $V_{IN}$ across a selected power source;

mirroring the sense current as a mirrored sense current;

generating from the output of a replica cell referenced to ground an output sense voltage $V_{OUT}$ based on the mirrored sense current;

establishing a feedback loop to cause the sense current and the mirrored sense current used to generate the output sense voltage $V_{OUT}$ to be substantially equal, such that output sense voltage $V_{OUT}$ is substantially equal to the input sense voltage $V_{IN}$.

19. The method of claim 18, further comprising:

using at least one cascode stage coupled to the sense module to reduce a voltage at which one or more signals from the sense module are referenced.

* * * * *